United States Patent
Nishio et al.

(10) Patent No.: US 9,373,686 B2
(45) Date of Patent: Jun. 21, 2016

(54) SEMICONDUCTOR DEVICE AND METHOD FOR MANUFACTURING SAME AND SEMICONDUCTOR SUBSTRATE

(71) Applicant: Kabushiki Kaisha Toshiba, Minato-ku (JP)

(72) Inventors: Johji Nishio, Tokyo (JP); Tatsuo Shimizu, Tokyo (JP); Chiharu Ota, Kanagawa-ken (JP); Takashi Shinohe, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/167,295

(22) Filed: Jan. 29, 2014

(65) Prior Publication Data

US 2014/0209927 A1    Jul. 31, 2014

(30) Foreign Application Priority Data

Jan. 30, 2013   (JP) .................................. 2013-015582

(51) Int. Cl.
| | |
|---|---|
| H01L 29/16 | (2006.01) |
| H01L 21/04 | (2006.01) |
| H01L 29/34 | (2006.01) |
| H01L 29/66 | (2006.01) |
| H01L 29/861 | (2006.01) |
| H01L 29/161 | (2006.01) |
| H01L 29/78 | (2006.01) |

(52) U.S. Cl.
CPC .......... *H01L 29/1608* (2013.01); *H01L 21/046* (2013.01); *H01L 29/161* (2013.01); *H01L 29/34* (2013.01); *H01L 29/6606* (2013.01); *H01L 29/66068* (2013.01); *H01L 29/7802* (2013.01); *H01L 29/8611* (2013.01); *H01L 29/8613* (2013.01)

(58) Field of Classification Search
CPC ............ H01L 29/1608; H01L 29/8611; H01L 29/161; H01L 29/8613; H01L 29/6606; H01L 29/34
See application file for complete search history.

(56) References Cited

U.S. PATENT DOCUMENTS

| | | | | |
|---|---|---|---|---|
| 5,322,802 | A * | 6/1994 | Baliga et al. ................... | 438/268 |
| 5,399,883 | A * | 3/1995 | Baliga .............................. | 257/57 |
| 5,449,925 | A * | 9/1995 | Baliga et al. ..................... | 257/77 |
| 5,543,637 | A * | 8/1996 | Baliga .............................. | 257/77 |
| 5,612,232 | A * | 3/1997 | Thero et al. ..................... | 438/571 |
| 5,895,260 | A * | 4/1999 | Bhatnagar et al. .............. | 438/571 |
| 6,023,078 | A * | 2/2000 | Baliga ............................. | 257/122 |
| 6,075,259 | A * | 6/2000 | Baliga .............................. | 257/77 |
| 6,373,076 | B1 * | 4/2002 | Alok et al. ....................... | 257/76 |
| 7,018,554 | B2 * | 3/2006 | Sumakeris ........ | H01L 21/30608 117/951 |
| 8,367,507 | B1 * | 2/2013 | Tsuchiya et al. ................ | 438/299 |
| 8,409,351 | B2 * | 4/2013 | Robbins et al. ................. | 117/103 |

(Continued)

FOREIGN PATENT DOCUMENTS

| | | |
|---|---|---|
| JP | 2011-236124 | 11/2011 |
| JP | 2014-187111 A | 10/2014 |

*Primary Examiner* — Matthew Landau
*Assistant Examiner* — Grant Withers
(74) *Attorney, Agent, or Firm* — Oblon, McClelland, Maier & Neustadt, L.L.P

(57) ABSTRACT

According to one embodiment, a semiconductor device includes a first semiconductor layer of a first conductivity type made of silicon carbide; and a second semiconductor layer of a second conductivity type made of silicon carbide, placed in junction with the first semiconductor layer, and containing an electrically inactive element.

16 Claims, 5 Drawing Sheets

(56) References Cited

U.S. PATENT DOCUMENTS

| | | | |
|---|---|---|---|
| 8,704,546 B2* | 4/2014 | Konstantinov | H01L 29/045 324/762.08 |
| 2003/0071277 A1* | 4/2003 | Lippert et al. | 257/197 |
| 2003/0071281 A1* | 4/2003 | Lippert et al. | 257/200 |
| 2003/0082882 A1* | 5/2003 | Babcock et al. | 438/309 |
| 2003/0162355 A1* | 8/2003 | Sankin et al. | 438/268 |
| 2005/0250289 A1* | 11/2005 | Babcock et al. | 438/309 |
| 2006/0011128 A1* | 1/2006 | Ellison | C30B 25/02 117/84 |
| 2006/0273323 A1* | 12/2006 | Yamamoto et al. | 257/77 |
| 2007/0018171 A1* | 1/2007 | Harris et al. | 257/76 |
| 2008/0087984 A1* | 4/2008 | Melas | 257/613 |
| 2008/0290466 A1* | 11/2008 | Niedernostheide et al. | 257/605 |
| 2009/0039358 A1* | 2/2009 | Tsuchida et al. | 257/77 |
| 2009/0114148 A1* | 5/2009 | Stahlbush | C30B 25/02 117/89 |
| 2009/0195296 A1* | 8/2009 | Miyanagi | H01L 23/345 327/530 |
| 2009/0200615 A1* | 8/2009 | Kanegae et al. | 257/369 |
| 2010/0200866 A1* | 8/2010 | Kitou | C30B 25/20 257/77 |
| 2011/0031507 A1* | 2/2011 | Tamaso | 257/77 |
| 2012/0139623 A1* | 6/2012 | Hashimoto et al. | 327/537 |
| 2012/0228630 A1* | 9/2012 | Shimizu et al. | 257/77 |
| 2012/0244675 A1* | 9/2012 | Wu et al. | 438/301 |
| 2013/0029158 A1* | 1/2013 | Aigo | C30B 25/10 428/446 |
| 2013/0037886 A1* | 2/2013 | Tsai et al. | 257/351 |
| 2013/0048014 A1* | 2/2013 | Shaviv et al. | 134/1.1 |
| 2013/0062624 A1* | 3/2013 | Tsuchiya et al. | 257/77 |
| 2013/0143396 A1* | 6/2013 | Sudarshan | H01L 21/02658 438/503 |
| 2013/0234158 A1* | 9/2013 | Kono et al. | 257/77 |
| 2013/0248880 A1* | 9/2013 | Ariyoshi et al. | 257/77 |
| 2014/0034965 A1* | 2/2014 | Ota et al. | 257/77 |
| 2014/0034966 A1* | 2/2014 | Nishio et al. | 257/77 |
| 2014/0175461 A1* | 6/2014 | Momose | C30B 25/20 257/77 |
| 2014/0183177 A1* | 7/2014 | Ota et al. | 219/209 |
| 2014/0183561 A1* | 7/2014 | Shimizu | 257/77 |
| 2014/0191247 A1* | 7/2014 | Iijima et al. | 257/77 |
| 2014/0264451 A1* | 9/2014 | Ozaki et al. | 257/194 |
| 2015/0060884 A1* | 3/2015 | Ota et al. | 257/77 |
| 2015/0060885 A1* | 3/2015 | Suzuki et al. | 257/77 |
| 2015/0084067 A1* | 3/2015 | Iijima et al. | 257/77 |
| 2015/0084068 A1* | 3/2015 | Shimizu | 257/77 |
| 2015/0087125 A1* | 3/2015 | Nishio et al. | 438/285 |
| 2015/0129897 A1* | 5/2015 | Sudarshan | C30B 25/186 257/77 |
| 2015/0155166 A1* | 6/2015 | Mahadik | C30B 29/36 257/77 |
| 2016/0005605 A1* | 1/2016 | Nishio | H01L 21/046 257/77 |

* cited by examiner

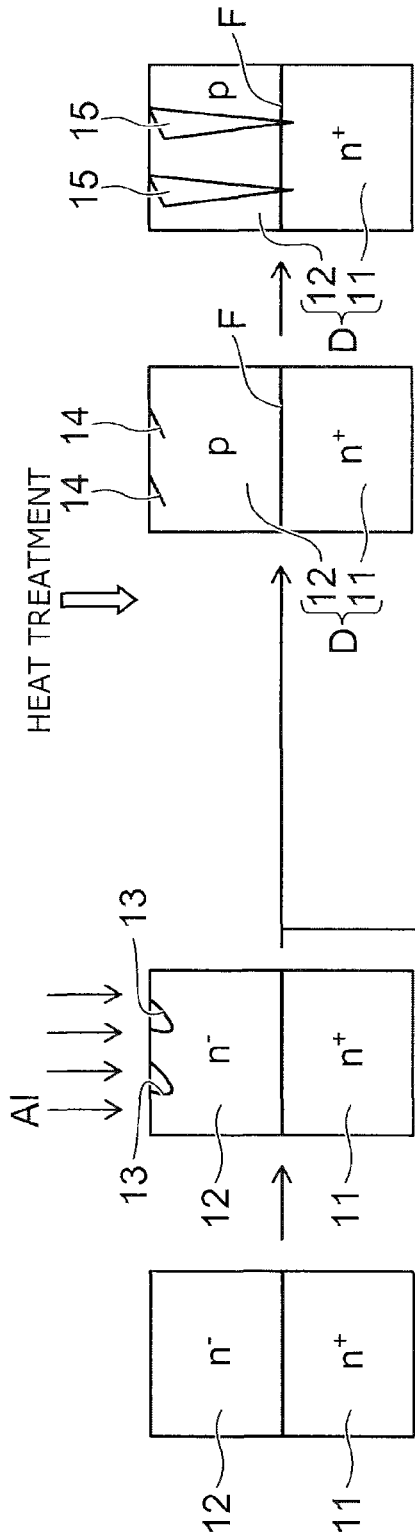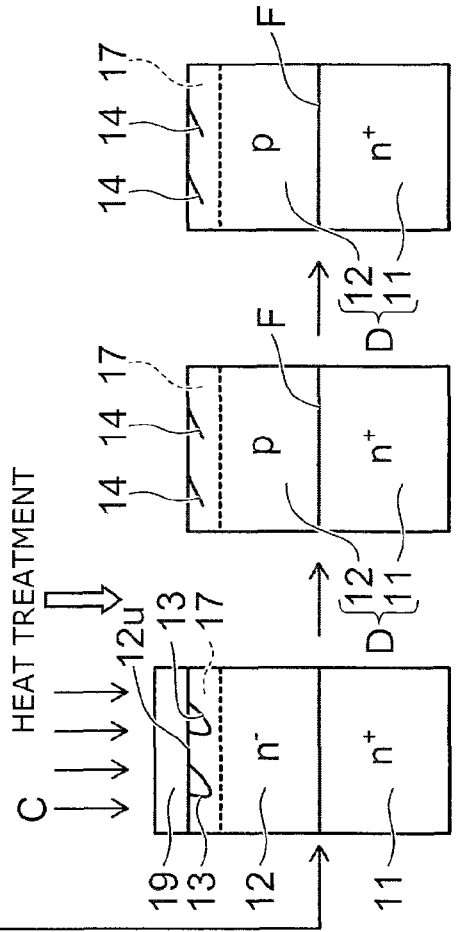

SEMICONDUCTOR DEVICE AND METHOD FOR MANUFACTURING SAME AND SEMICONDUCTOR SUBSTRATE

CROSS-REFERENCE TO RELATED APPLICATIONS

This application is based upon and claims the benefit of priority from Japanese Patent Application No.2013-015582, filed on Jan. 30, 2013; the entire contents of which are incorporated herein by reference.

FIELD

Embodiments described herein relate generally to a semiconductor device and method for manufacturing same and semiconductor substrate.

BACKGROUND

Conventionally, in semiconductor devices, silicon has often been used as a semiconductor material. In contrast, recently, toward the characteristics improvement of semiconductor devices such as even higher breakdown voltage, larger operating current, and lower loss, a semiconductor device using silicon carbide (SiC) as a semiconductor material has been developed. For widespread use of semiconductor devices using silicon carbide, the manufacturing cost thereof needs to be reduced. To this end, it is effective to use a large diameter silicon carbide wafer.

BRIEF DESCRIPTION OF THE DRAWINGS

FIGS. 1A to 1G are process sectional views schematically illustrating a method for manufacturing a semiconductor device according to an embodiment in comparison with a comparative example;

DETAILED DESCRIPTION

Figures 2A, 2B:
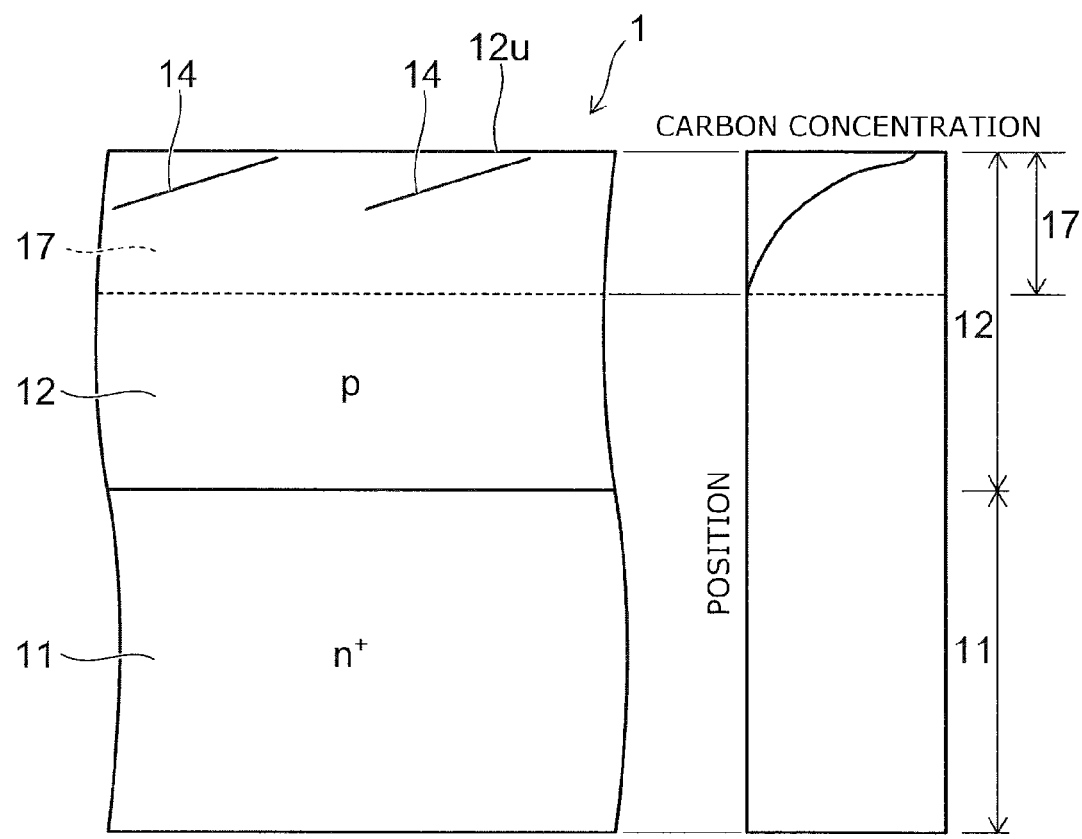
FIG. 2A is a sectional view illustrating the semiconductor substrate according to the embodiment.
FIG. 2B is a graph illustrating a carbon concentration profile in the semiconductor substrate.

In general, according to one embodiment, a semiconductor device includes a first semiconductor layer of a first conductivity type made of silicon carbide; and a second semiconductor layer of a second conductivity type made of silicon carbide, placed in junction with the first semiconductor layer, and containing an electrically inactive element.

In general, according to another embodiment, a method for manufacturing a semiconductor device includes: implanting an electrically inactive element into an upper portion of a substrate made of silicon carbide and including a lower portion and the upper portion, the lower portion containing at least one of an impurity serving as a donor and an impurity serving as an acceptor, and the upper portion containing at least the other of the impurity serving as the donor and the impurity serving as the acceptor; and turning the lower portion to a first conductivity type and the upper portion to a second conductivity type by performing heat treatment on the substrate to activate the impurity serving as the donor and the impurity serving as the acceptor.

In general, according to another embodiment, a semiconductor substrate includes: a first semiconductor layer of a first conductivity type made of silicon carbide; and a second semiconductor layer of a second conductivity type made of silicon carbide, placed in junction with the first semiconductor layer, and containing an electrically inactive element.

Embodiments of the invention will now be described with reference to the drawings.

First, a first embodiment is described.

In this embodiment, a method for manufacturing a semiconductor device using silicon carbide (SiC) as a semiconductor material is briefly described in comparison with a comparative example.

FIGS. 1A to 1G are process sectional views schematically illustrating a method for manufacturing a semiconductor device according to this embodiment in comparison with a comparative example.

FIGS. 1A and 1B show steps common to this embodiment and the comparative example. FIGS. 1C and 1D show steps of the comparative example performed after the step shown in FIG. 1B. FIGS. 1E, 1F, and 1G show steps of this embodiment performed after the step shown in FIG. 1B.

First, as shown in FIG. 1A, a wafer 11 made of monocrystalline SiC is prepared. The wafer 11 contains an impurity serving as a donor for SiC, such as nitrogen (N). Thus, the conductivity type of the wafer 11 is $n^+$-type. The diameter of the wafer 11 is e.g. 6 inches or more. The upper surface and the lower surface of the wafer 11 are inclined e.g. 4° with respect to the (0001) surface, which is the basal plane of SiC crystal.

Next, an epitaxial layer 12 is epitaxially grown on the upper surface of the wafer 11. The epitaxial layer 12 contains an impurity serving as a donor, such as nitrogen (N). Thus, the conductivity type of the epitaxial layer 12 is $n^-$-type. The donor concentration of the epitaxial layer 12 is lower than the donor concentration of the wafer 11. In this specification, the region denoted as "$n^-$", "$p^-$" has lower impurity concentration than the region denoted as "n", "p". The region denoted as "n", "p" has lower impurity concentration than the region denoted as "$n^+$", "$p^+$".

Next, as shown in FIG. 1B, an impurity serving as an acceptor for SIC, such as aluminum (Al), is ion implanted from above. At this stage, the substrate made of the wafer 11 and the epitaxial layer 12 is made of SiC. The lower portion (wafer 11) contains an impurity serving as a donor. The upper portion (epitaxial layer 12) contains an impurity serving as a donor and an impurity serving as an acceptor. Here, the lower portion may also contain an impurity serving as an acceptor. However, in this embodiment, the concentration of the impurity serving as an acceptor in the lower portion (wafer 11) needs to be lower than the concentration of the impurity serving as a donor. By this ion implantation of the impurity, dislocation half loops 13 are formed in the upper layer portion of the epitaxial layer 12.

Then, in the comparative example of this embodiment, as shown in FIG. 1C, heat treatment is performed to activate the impurity (e.g., aluminum) ion-implanted in FIG. 1B. The temperature of this heat treatment is set to e.g. 1600-1900° C. This activates the implanted impurity and turns the conductivity type of the epitaxial layer 12 from n⁻-type to p-type. As a result, the interface between the wafer 11 and the epitaxial layer 12 turns to a p-n interface F. Thus, a p-n diode D is formed from the wafer 11 and the epitaxial layer 12. In this heat treatment, dislocation half loops 13 are generated also by sublimation of SiC from the upper surface of the epitaxial layer 12.

In this heat treatment, in the cooling process of the wafer 11, the peripheral portion of the wafer 11 is cooled earlier than the central portion thereof. This inevitably produces a temperature difference in the wafer 11 and causes thermal stress. This thermal stress becomes larger as the diameter of the wafer 11 becomes larger. Application of this thermal stress to the dislocation half loop 13 generates a basal plane dislocation 14 resulting from the half loop 13. The basal plane dislocation 14 refers to a dislocation generated in the (0001) surface of SiC crystal, and includes both an edge dislocation and a screw dislocation.

Then, as shown in FIG. 1D, the basal plane dislocation 14 is decomposed into partial dislocations. Between the partial dislocations, a single Shockley type stacking fault 15 occurs. If this stacking fault reaches the p-n interface F, the forward voltage characteristic of the p-n diode D is degraded.

In contrast, in this embodiment, after the step shown in FIG. 1B, as shown in FIG. 1E, a mask 19 is formed on the epitaxial layer 12. The mask 19 is formed from e.g. resist or silicon oxide ($SiO_2$). Then, an electrically inactive element is ion implanted through the mask 19 from above. The "electrically inactive element" refers to an element not contributing to conduction in SiC. For instance, the "electrically inactive element" is carbon (C). According to the investigation by the inventors, carbon entering any site of SiC crystal does not affect the conductivity of SiC. Thus, a carbon-containing layer 17 is formed in the upper portion of the epitaxial layer 12. Here, the dose amount of carbon is set to e.g. $1\times10^{11}$-$1\times10^{12}$ cm$^{-2}$. The acceleration energy of carbon ions is set to a value such that carbon is implanted into only the upper portion of the epitaxial layer 12 and that the carbon concentration profile in the vertical direction is maximized at the upper surface 12u of the epitaxial layer 12. Then, the mask 19 is removed.

Next, as shown in FIG. 1F, heat treatment is performed to activate the impurity (e.g., aluminum) ion-implanted in FIG. 1B. This heat treatment is similar to the heat treatment shown in FIG. 1C. This causes sublimation of SiC from the upper surface of the epitaxial layer 12 and further generates dislocation half loops 13. Then, in the cooling process of the heat treatment, thermal stress is applied to the dislocation half loop 13 and generates a basal plane dislocation 14.

However, as shown in FIG. 1G, in this embodiment, movement of the basal plane dislocation 14 is blocked by carbon atoms contained in the carbon-containing layer 17. This suppresses change of the basal plane dislocation 14 into a stacking fault 15. This can prevent degradation of the forward voltage characteristic of the p-n diode D due to the stacking fault 15. Thus, by the steps shown in FIGS. 1A, 1B, 1E, 1F, and 1G, a semiconductor substrate 1 according to this embodiment is manufactured.

FIG. 2A is a sectional view illustrating the semiconductor substrate according to this embodiment. FIG. 2B is a graph illustrating the carbon concentration profile in the semiconductor substrate, where the vertical axis represents position, and the vertical axis represents carbon concentration.

The position represented on the vertical axis of FIG. 2B corresponds to the position in FIG. 2A.

As shown in FIG. 2A, the semiconductor substrate 1 according to this embodiment manufactured as described above includes an n⁺-type wafer 11 made of silicon carbide (SiC) monocrystal and a p-type epitaxial layer 12 made of SiC. The wafer 11 contains an impurity serving as a donor, such as nitrogen. The epitaxial layer 12 contains both an impurity serving as a donor, such as nitrogen, and an impurity serving as an acceptor, such as aluminum. The epitaxial layer 12 is provided on the wafer 11, and placed in junction with the wafer 11. The term "in junction with" refers to making a p-n junction, and includes both the case where the epitaxial layer 12 is in contact with the wafer 11, and the case where an intervening layer such as an intrinsic semiconductor layer exists between the wafer 11 and the epitaxial layer 12 to the extent of not impairing the p-n junction. In this embodiment, the epitaxial layer 12 is in contact with the wafer 11. The epitaxial layer 12 forms a p-n interface F with the wafer 11. Thus, the epitaxial layer 12 in combination with the wafer 11 constitutes a p-n diode D. Furthermore, the upper portion of the epitaxial layer constitutes a carbon-containing layer 17. In the carbon-containing layer 17, basal plane dislocations 14 are generated, but scarcely changed into stacking faults 15.

As shown in FIG. 2B, the carbon-containing layer 17 contains carbon as an electrically inactive element. On the other hand, the wafer 11 and the portion (hereinafter referred to as "lower portion 12b") of the epitaxial layer 12 other than the carbon-containing layer 17 do not substantially contain carbon. The carbon concentration profile along the vertical direction in the semiconductor substrate 1 is maximized at the upper surface 12u of the epitaxial layer 12, and decreased downward, i.e., toward the wafer 11 side. The thickness of the carbon-containing layer 17 is e.g. 1-2 μm. The thickness of the lower portion 12b of the epitaxial layer 12 is e.g. 5 μm or more.

Next, a method for manufacturing a semiconductor device using the semiconductor substrate 1 shown in FIGS. 2A and 2B as a semiconductor device fabrication substrate is described.

Figures 3A, 3B:
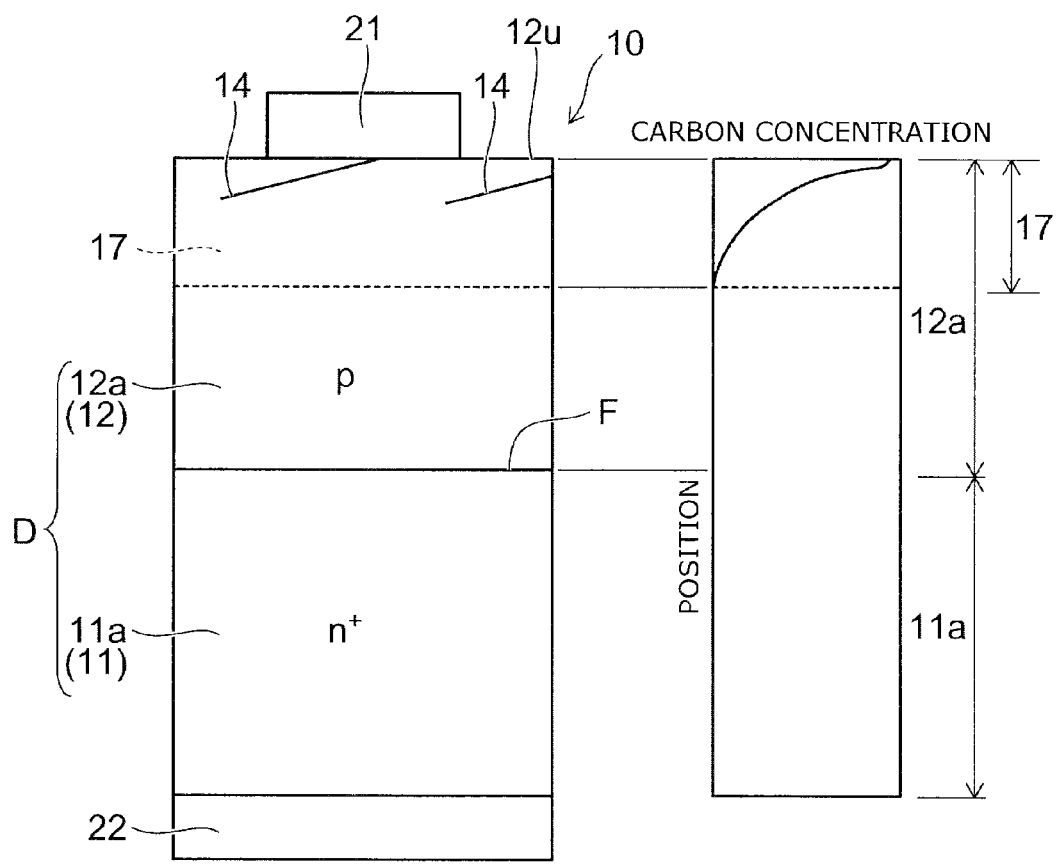
FIG. 3A is a sectional view illustrating the semiconductor device according to the embodiment.
FIG. 3B is a graph illustrating a carbon concentration profile in the semiconductor device.

FIG. 3A is a sectional view illustrating the semiconductor device according to this embodiment. FIG. 3B is a graph illustrating the carbon concentration profile in the semiconductor device, where the vertical axis represents position, and the vertical axis represents carbon concentration.

As shown in FIG. 3A, an electrode 21 is formed on the upper surface 12u of the epitaxial layer 12 of the semiconductor substrate 1 (see FIG. 2A). The electrode 21 is connected to the epitaxial layer 12. On the other hand, an electrode 22 is formed on the lower surface of the wafer 11. The electrode 22 is connected to the wafer 11. Next, the stacked body made of the electrode 22, the wafer 11, the epitaxial layer 12, and the electrode 21 is singulated by dicing. Thus, a plurality of semiconductor devices 10 are manufactured. Here, each singulated portion of the wafer 11 constitutes an n⁺-type layer 11a. Each singulated portion of the epitaxial layer 12 constitutes a p-type layer 12a. The semiconductor device 10 is a bipolar device using SiC as a semiconductor.

As shown in FIGS. 3A and 3B, the semiconductor device 10 includes an n⁺-type layer 11a. A p-type layer 12a is provided thereon. On the p-type layer 12a, an electrode 21 is provided. Below the n⁺-type layer 11a, an electrode 22 is provided. The configuration of the n⁺-type layer 11a and the p-type layer 12a in the semiconductor device 10 is similar to the configuration of the wafer 11 and the epitaxial layer 12 in the semiconductor substrate 1 (see FIGS. 2A and 2B). That is, the upper portion of the p-type layer 12a constitutes a carbon-containing layer 17 containing carbon. The carbon concentration profile along the vertical direction in the semiconductor device 10 is maximized at the upper surface of the p-type layer 12a. In the p-type layer 12a, basal plane dislocations 14 are formed, but no stacking fault 15 (see FIG. 1D) is generated.

Next, the effect of this embodiment is described. As described above, in the step shown in FIG. 1B, an impurity is ion implanted. Then, dislocation half loops 13 are generated near the upper surface 12u of the epitaxial layer 12. Subsequently, heat treatment for activating the impurity is performed. Then, dislocation half loops 13 are further generated by sublimation of SiC. In the comparative example without implantation of carbon, thermal stress applied to the half loop 13 in the cooling process of heat treatment generates a basal plane dislocation 14 near the upper surface 12u as shown in FIG. 1C. The basal plane dislocation 14 turns to a stacking fault 15 as shown in FIG. 1D. Thus, the forward voltage characteristic of the p-n diode D is degraded.

Figure 4:
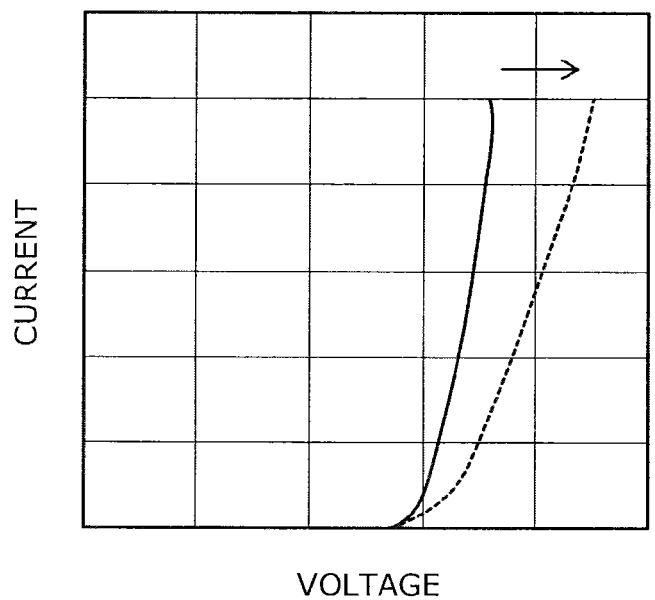
FIG. 4 is a graph illustrating a characteristics change of a p-n diode according to a comparative example.

FIG. 4 is a graph illustrating the characteristics change of the p-n diode according to the comparative example, where the horizontal axis represents voltage, and the vertical axis represents current.

In FIG. 4, the solid line indicates the characteristic of the p-n diode before application of voltage stress. The dashed line indicates the characteristic of the p-n diode after application of voltage stress.

As shown in FIG. 4, in the p-n diode according to the comparative example, with the application of stress, the on-resistance is decreased.

In contrast, in this embodiment, in the step shown in FIG. 1E, carbon as an electrically inactive element is ion implanted into the epitaxial layer 12. Thus, by the ion implantation of the impurity and the heat treatment, dislocation half loops 13 are generated. As shown in FIG. 1F, application of thermal stress to this half loop 13 generates a basal plane dislocation 14. Nevertheless, as shown in FIG. 1G, the basal plane dislocation 14 is immobilized by carbon atoms. Thus, change of the basal plane dislocation 14 into a stacking fault 15 can be suppressed. This can prevent the degradation of the forward voltage characteristic of the p-n diode D.

Thus, as the wafer 11, a wafer having a large diameter, such as a diameter of 6 inches or more, can be used. This may increase thermal stress in the cooling process of heat treatment for activating the impurity. However, even in this case, the degradation of the forward voltage characteristic of the p-n diode D can be suppressed. Use of a large diameter wafer can reduce the manufacturing cost of the semiconductor device. Furthermore, use of silicon carbide (SiC) as a semiconductor can realize a semiconductor device with high breakdown voltage, large current performance, and low current loss. As a result, according to this embodiment, a semiconductor device with low cost and good characteristics can be obtained.

Furthermore, in this embodiment, carbon is implanted into only the upper portion of the epitaxial layer 12 (p-type layer 12a). That is, the carbon-containing layer 17 is formed in only the upper portion of the epitaxial layer 12. Thus, the basal plane dislocation 14 generated near the upper surface 12u of the epitaxial layer 12 is confined in the upper portion of the epitaxial layer 12. This can reliably prevent the basal plane dislocation 14 from reaching the p-n interface F. As a result, the degradation of the characteristics of the p-n diode can be reliably avoided.

In particular, in this embodiment, by adjusting the ion implantation condition of carbon, the carbon concentration profile along the vertical direction in the epitaxial layer 12 is controlled so as to be maximized at the upper surface 12u of the epitaxial layer 12. Thus, the basal plane dislocation 14 is efficiently immobilized by carbon. This can achieve more significantly the aforementioned effect of confining the basal plane dislocation 14 in the upper portion of the epitaxial layer 12.

Furthermore, in this embodiment, in order to immobilize the basal plane dislocation 14, carbon is implanted as an electrically inactive element. Carbon atoms are less likely to diffuse in SiC. Thus, the formation region of the carbon-containing layer 17 can be accurately controlled.

Moreover, in this embodiment, the dose amount of carbon is set to $1 \times 10^{11}$ cm$^{-2}$ or more. Thus, the aforementioned effect can be reliably achieved. On the other hand, the dose amount of carbon is set to $1 \times 10^{12}$ cm$^{-2}$ or less. This can suppress damage to the SiC crystal lattice of the epitaxial layer 12 due to the ion implantation of carbon.

Moreover, in this embodiment, the thickness of the lower portion 12b of the epitaxial layer 12, i.e., the portion of the epitaxial layer 12 below the carbon-containing layer 17, is set to 5 µm or more. Thus, the distance between the upper surface 12u of the epitaxial layer 12 (p-type layer 12a) and the p-n interface F is sufficiently ensured. This can suppress that defects generated at the upper surface 12u reach the p-n interface F. This can also maintain good characteristics of the semiconductor device. Furthermore, this can suppress that the recombination energy of electrons and holes at the p-n interface F reaches the neighborhood of the upper surface 12u. This can prevent more reliably the basal plane dislocation 14 generated near the upper surface 12u from growing into a stacking fault 15.

Here, it may also be considered that after the ion implantation step shown in FIG. 1B, the upper portion of the epitaxial layer 12, i.e., the portion in which defects such as dislocation half loops 13 are generated by the ion implantation, is removed by means of such as etching. This can remove most of the dislocation half loops 13. Thus, it may be considered that this can suppress generation of basal plane dislocations 14, and suppress generation of stacking faults 15. However, in this case, the distance between the upper surface 12u of the epitaxial layer 12 (p-type layer 12a) and the p-n interface F is made short. Thus, the small number of remaining dislocation half loops 13 are made susceptible to the recombination energy of electrons and holes at the p-n interface F. Thus, on the contrary, stacking faults 15 are made more likely to occur.

The second to fourth embodiments described below are examples in which the above first embodiment is applied to various devices.

First, a second embodiment is described.

The semiconductor device according to the second embodiment includes a mesa pin diode formed by epitaxial growth technique.

Figure 5:
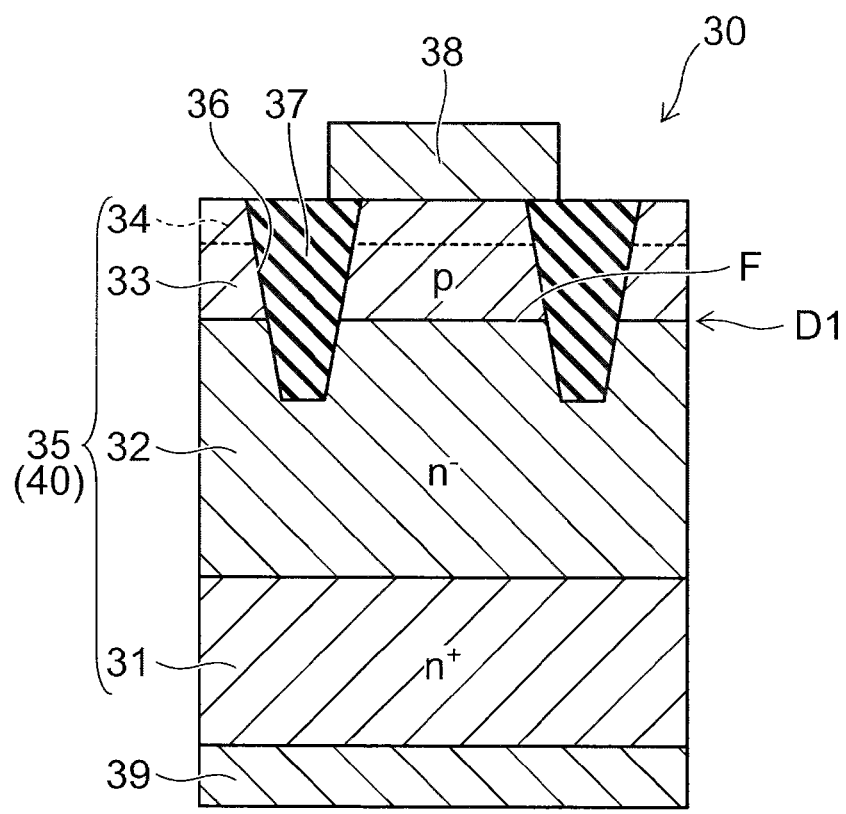
FIG. 5 is a sectional view illustrating a semiconductor device according to the embodiment.

FIG. 5 is a sectional view illustrating a semiconductor device according to this embodiment.

As shown in FIG. 5, the semiconductor device 30 according to this embodiment includes an n$^+$-type layer 31. The n$^+$-type layer 31 is made of monocrystalline silicon carbide (SiC), and contains an impurity serving as a donor, such as nitrogen (N). Thus, the conductivity type of the n$^+$-type layer 31 is n-type. The upper surface and the lower surface of the n$^+$-type layer 31 are inclined e.g. 4° with respect to the (0001) surface of SiC.

On the n$^+$-type layer 31, an n$^-$-type layer 32 is provided. The n$^-$-type layer 32 is made of monocrystalline SiC, and contains an impurity serving as a donor, such as nitrogen (N). Thus, the conductivity type of the n$^-$-type layer 32 is n-type. The donor concentration of the n$^-$-type layer 32 is lower than the donor concentration of the n$^+$-type layer 31.

On the n⁻-type layer 32, a p-type layer 33 is formed. The p-type layer 33 is made of monocrystalline SiC, and contains both an impurity serving as a donor, such as nitrogen (N), and an impurity serving as an acceptor, such as aluminum (Al). However, the aluminum concentration is higher than the nitrogen concentration. Thus, as a whole, the conductivity type of the p-type layer 33 is p-type. The upper portion of the p-type layer 33 constitutes a carbon-containing layer 34 containing carbon. The carbon concentration profile along the vertical direction in the p-type layer 33 is maximized at the upper surface of the p-type layer 33, decreases downward, and becomes substantially zero at the lower surface of the carbon-containing layer 34.

The n⁺-type layer 31, the n⁻-type layer 32, and the p-type layer 33 form a stacked body 35. The stacked body 35 also includes the carbon-containing layer 34. In the stacked body 35, a plurality of trenches 36 are formed from the upper surface side. In each trench 36, a device isolation insulator 37 is embedded. The device isolation insulator 37 penetrates through the p-type layer 33 and reaches halfway through the n⁻-type layer 32.

On the portion of the p-type layer 33 sandwiched between the device isolation insulators 37, an anode electrode 38 is provided. The anode electrode 38 is connected to the p-type layer 33. On the other hand, on the lower surface of the n⁺-type layer 31, a cathode electrode 39 is provided. The cathode electrode 39 is connected to the n⁺-type layer 31. Thus, for each portion of the stacked body 35 sandwiched between the device isolation insulators 37, a mesa pin diode D1 is formed. In the mesa pin diode D1, the interface between the n⁻-type layer 32 and the p-type layer 33 constitutes a p-n interface F.

Next, a method for manufacturing the semiconductor device 30 configured as in the foregoing is described. First, an n⁺-type wafer made of silicon carbide (SiC) monocrystal is prepared as an n⁺-type layer 31. The diameter of this wafer is 6 inches or more. Next, an n⁻-type layer 32 is epitaxially grown on the wafer. Next, a p-type layer 33 is epitaxially grown on the n⁻-type layer 32. Next, carbon (C) is ion implanted from above. Thus, the upper portion of the p-type layer 33 is turned to a carbon-containing layer 34. Next, heat treatment is performed to activate the impurity of each layer. The temperature of the heat treatment is set to e.g. 1600-1900° C.

By this heat treatment, SiC sublimes at the upper surface of the p-type layer 33. Thus, dislocation half loops (not shown) are generated. In the process of cooling, under thermal stress, the dislocation half loop turns to a basal plane dislocation (not shown). However, the basal plane dislocation is immobilized by carbon. Thus, the basal plane dislocation does not turn to a stacking fault. Accordingly, a semiconductor substrate 40 is manufactured. In the semiconductor substrate 40, the n⁺-type layer 31, the n⁻-type layer 32, and the p-type layer 33 are stacked in this order. The upper portion of the p-type layer 33 constitutes a carbon-containing layer 34. The semiconductor substrate 40 is shaped like a wafer having a diameter of e.g. 6 inches or more.

Next, trenches 36 are formed from the upper surface side of the semiconductor substrate 40. The trench 36 is formed so as to penetrate through the p-type layer 33 and to reach halfway through the n⁻-type layer 32. Next, a device isolation insulator 37 is embedded into the trench 36. Next, an anode electrode 38 is formed on the upper surface of the semiconductor substrate 40, and a cathode electrode 39 is formed on the lower surface of the semiconductor substrate 40. Next, the structural body made of the semiconductor substrate 40, the device isolation insulators 37, the anode electrode 38, and the cathode electrode 39 is diced and singulated into a plurality of pieces. Thus, a plurality of semiconductor devices 30 are manufactured.

The configuration, manufacturing method, and effect of this embodiment other than the foregoing are similar to those of the above first embodiment.

Next, a third embodiment is described.

The semiconductor device according to the third embodiment includes a planar pin diode formed by ion implantation technique.

Figure 6:
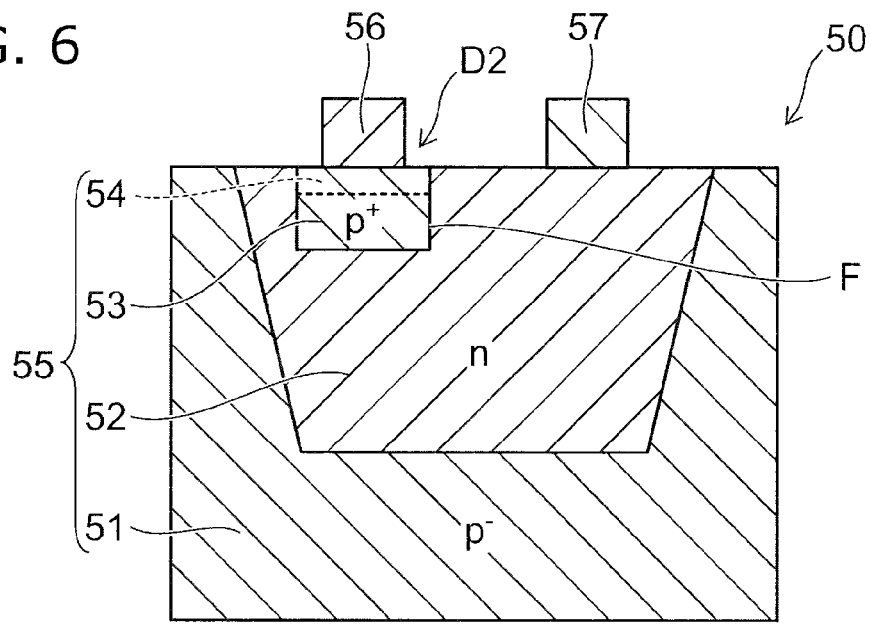
FIG. 6 is a sectional view illustrating a semiconductor device according to the embodiment.

FIG. 6 is a sectional view illustrating a semiconductor device according to this embodiment.

As shown in FIG. 6, the semiconductor device 50 according to this embodiment includes a p⁻-type layer 51. In part of the upper portion of the p⁻-type layer 51, an n-type layer 52 is provided. In part of the upper portion of the n-type layer 52, a p-type layer 53 is provided. The upper portion of the p-type layer 53 is doped with carbon to constitute a carbon-containing layer 54. The p⁻-type layer 51, the n-type layer 52, and the p-type layer 53 including the carbon-containing layer 54 form a SiC substrate 55 made of SiC monocrystal.

On a portion of the SiC substrate 55, an anode electrode 56 is provided and connected to the p-type layer 53. On another portion of the SiC substrate 55, a cathode electrode 57 is provided and connected to the n-type layer 52. In the semiconductor device 50, the n-type layer 52 and the p-type layer 53 form a planar pin diode D2. In the planar pin diode D2, the interface between the n-type layer 52 and the p-type layer 53 constitutes a p-n interface F.

Next, a method for manufacturing the semiconductor device 50 configured as in the foregoing is described.

First, a p⁻-type wafer made of silicon carbide (SiC) monocrystal is prepared as a p⁻-type layer 51. The diameter of this wafer is 6 inches or more. Next, a first mask (not shown) is formed on the wafer. An impurity serving as a donor is selectively ion implanted to form an n-type layer 52 in part of the upper portion of the p⁻-type layer 51. Then, the first mask is removed.

Next, a second mask (not shown) is formed on the wafer. An impurity serving as an acceptor is selectively ion implanted to form a p-type layer 53 in part of the upper portion of the n-type layer 52. At this time, by the ion implantation, dislocation half loops (not shown) are formed near the upper surface of the p-type layer 53. Next, by continuously using the second mask, carbon is ion implanted to turn the upper portion of the p-type layer 53 to a carbon-containing layer 54. Then, the second mask is removed. Thus, a SiC substrate 55 is formed.

Next, heat treatment is performed to activate the impurity of each layer. The temperature of the heat treatment is set to e.g. 1600-1900° C. By this heat treatment, SiC sublimes at the upper surface of the p-type layer 53. Thus, dislocation half loops are further generated. In the process of cooling, under thermal stress, the dislocation half loop turns to a basal plane dislocation (not shown). However, the basal plane dislocation is immobilized by carbon. Thus, the basal plane dislocation does not turn to a stacking fault.

Next, an anode electrode 56 is formed on the p-type layer 53, and a cathode electrode 57 is formed on the n-type layer 52. Next, the structural body made of the SiC substrate 55, the anode electrode 56, and the cathode electrode 57 is diced and singulated into a plurality of pieces. Thus, a plurality of semiconductor devices 50 are manufactured.

The configuration, manufacturing method, and effect of this embodiment other than the foregoing are similar to those of the above first embodiment.

Next, a fourth embodiment is described.

The semiconductor device according to the fourth embodiment includes a planar gate MOSFET (metal-oxide-semiconductor field-effect transistor) formed by ion implantation technique.

Figure 7:
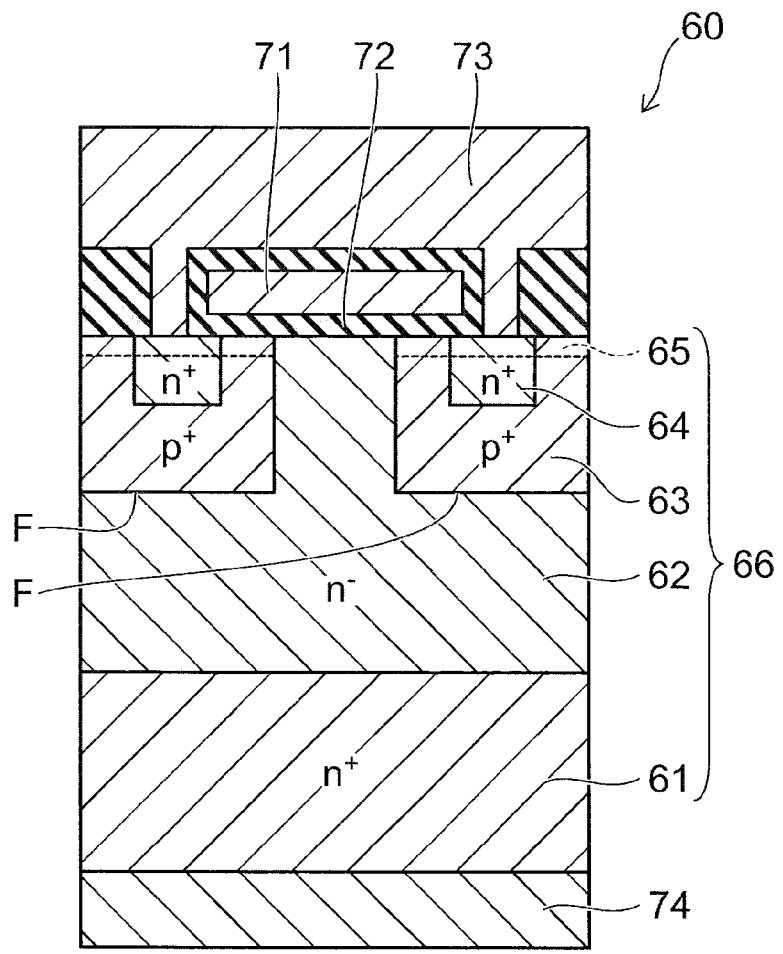
FIG. 7 is a sectional view illustrating a semiconductor device according to the embodiment.

FIG. 7 is a sectional view illustrating a semiconductor device according to this embodiment.

As shown in FIG. 7, the semiconductor device 60 according to this embodiment includes an $n^+$-type layer 61. On the $n^+$-type layer 61, an $n^-$-type layer 62 is provided. In part of the upper portion of the $n^-$-type layer 62, a plurality of $p^+$-type layers 63 are provided and spaced from each other. In part of the upper portion of each $p^+$-type layer 63, an $n^+$-type layer 64 is provided and spaced from the $n^-$-type layer 62. The upper portion of the $p^+$-type layer 63 and the $n^+$-type layer 64 constitutes a carbon-containing layer 65 containing carbon. The $n^+$-type layer 61, the $n^-$-type layer 62, the $p^+$-type layer 63, and the $n^+$-type layer 64 form a SiC substrate 66. The SiC substrate 66 also includes the carbon-containing layer 65.

On the SiC substrate 66, a gate electrode 71 is provided.

The gate electrode 71 is placed at least immediately above the portion of the $p^+$-type layer 63 located between the $n^-$-type layer 62 and the $n^+$-type layer 64. Around the gate electrode 71, an insulating film 72 is provided. The portion of the insulating film 72 located between the SiC substrate 66 and the gate electrode 71 constitutes a gate insulating film. On the SiC substrate 66, a source electrode 73 is provided so as to cover the insulating film 72. The source electrode is connected to the $n^+$-type layer 64. Furthermore, on the lower surface of the SiC substrate 66, a drain electrode 74 is provided. The drain electrode 74 is connected to the $n^+$-type layer 61.

In the semiconductor device 60, the $n^+$-type layer 61 constitutes a drain layer. The $n^-$-type layer 62 constitutes a drift layer. The $p^+$-type layer 63 constitutes a base layer. The $n^+$-type layer 64 constitutes a source layer. Thus, a planar gate MOSFET is formed. In this planar gate MOSFET, the interface between the $n^-$-type layer 62 and the $p^+$-type layer 63 constitutes a p-n interface F.

Next, a method for manufacturing the semiconductor device 60 configured as in the foregoing is described.

First, an $n^+$-type wafer made of silicon carbide (SiC) monocrystal is prepared as an $n^+$-type layer 61. The diameter of this wafer is 6 inches or more. Next, an $n^-$-type layer 62 is epitaxially grown on this wafer. Next, a first mask (not shown) is formed on the $n^-$-type layer 62. An impurity serving as an acceptor is selectively ion implanted to form a $p^+$-type layer 63 in part of the upper portion of the $n^-$-type layer 62. By this ion implantation, dislocation half loops are formed near the upper surface of the $p^+$-type layer 63. Next, by continuously using the first mask, carbon is ion implanted to turn the upper portion of the $p^{30}$-type layer 63 to a carbon-containing layer 65. Then, the first mask is removed.

Next, a second mask (not shown) is formed. An impurity serving as a donor is ion implanted to form an $n^+$-type layer 64 in part of the upper portion of the $p^+$-type layer 63. At this time, the upper portion of the $n^+$-type layer 64 turns to a carbon-containing layer 65. By this ion implantation, dislocation half loops are formed near the upper surface of the $n^+$-type layer 64. Then, the second mask is removed. Thus, a SiC substrate 66 is fabricated.

Next, heat treatment is performed to activate the impurity of each layer. The temperature of the heat treatment is set to e.g. 1600-1900° C. By this heat treatment, SiC sublimates at the upper surface of the SiC substrate 66. Thus, dislocation half loops are further generated. In the process of cooling, under thermal stress, the dislocation half loop turns to a basal plane dislocation. However, in the $p^+$-type layer 63 and the $n^+$-type layer 64, the basal plane dislocation is immobilized by carbon. Thus, the basal plane dislocation does not turn to a stacking fault.

Next, on the SiC substrate 66, a gate electrode 71 and an insulating film 72 are formed. Next, a source electrode 73 is formed so as to cover the insulating film 72 and connected to the $n^+$-type layer 64. On the other hand, on the lower surface of the SiC substrate 66, a drain electrode 74 is formed and connected to the $n^+$-type layer 61. Next, the structural body made of the SiC substrate 66, the gate electrode 71, the insulating film 72, the source electrode 73, and the drain electrode 74 is diced and singulated into a plurality of pieces. Thus, a plurality of semiconductor devices 60 are manufactured.

The configuration, manufacturing method, and effect of this embodiment other than the foregoing are similar to those of the above first embodiment.

In the example of the above embodiments, carbon is implanted as an electrically inactive element. However, the embodiments are not limited thereto as long as the electrically inactive element does not affect the conductivity of silicon carbide. In the example of the above embodiments, the impurity concentration profile along the vertical direction in the p-type layer 12a, the p-type layer 33, the p-type layer 53, and $p^+$-type layer 63 (hereinafter collectively referred to as "p-type layer") is maximized at the upper surface of the p-type layer. However, the embodiments are not limited thereto. The impurity concentration profile may be maximized at a position lower than the upper surface. Furthermore, in the example of the above embodiments, the carbon-containing layer is formed in only the upper portion of the p-type layer. However, the embodiments are not limited thereto. The p-type layer may entirely constitute a carbon-containing layer. Alternatively, the carbon-containing layer may be formed in only the lower portion of the p-type layer. Moreover, in the above embodiments, several numerical ranges are illustrated. However, the embodiments are not limited to these numerical ranges.

Moreover, in the example of the above embodiments, a p-type layer is placed on an n-type layer, and carbon is contained in the p-type layer. However, the embodiments are not limited thereto. An n-type layer may be placed on a p-type layer, and carbon may be contained in the n-type layer. The electrically inactive element only needs to be placed between the p-n interface and the region in which the basal plane dislocation is formed at least immediately before performing heat treatment.

The embodiments described above can realize a semiconductor device and a method for manufacturing the same and a semiconductor substrate with low cost and good characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first semiconductor layer of a first conductivity type made of silicon carbide; and a second semiconductor layer of a second conductivity type made of silicon carbide, the second semiconductor layer being provided on the first semiconductor layer, being placed injunction with the first semiconductor layer, and including an electrically inactive element contained in an upper portion of the second semiconductor layer, a basal plane dislocation being generated at an upper surface of the upper portion, and terminated in the upper portion.

2. The device according to claim 1, wherein the element is carbon.

3. The device according to claim 1, wherein a concentration profile of the element along stacking direction of the first semiconductor layer and the second semiconductor layer in the second semiconductor layer is maximized at a surface of the second semiconductor layer on far side from the first semiconductor layer.

4. The device according to claim 1, wherein
the second semiconductor layer is placed on the first semiconductor layer, and
the second semiconductor layer includes:
an upper portion containing the element; and
a lower portion not containing the element.

5. The device according to claim 4, wherein thickness of the lower portion of the second semiconductor layer is 0.5 μm or more.

6. The device according to claim 1, wherein dose amount of the element is $1\times10^{11}$-$1\times10^{12}$ cm$^{-2}$.

7. The device according to claim 1, wherein
the second semiconductor layer is placed on the first semiconductor layer, and
the device further comprises:
a first electrode placed below the first semiconductor layer and connected to the first semiconductor layer; and
a second electrode placed above the second semiconductor layer and connected to the second semiconductor layer.

8. The device according to claim 1, wherein
the second semiconductor layer is placed on part of the first semiconductor layer, and
the device further comprises:
a first electrode placed on a region of the first semiconductor layer where the second semiconductor layer is not placed, the first electrode being connected to the first semiconductor layer; and
a second electrode placed on a region of the first semiconductor layer and on the second semiconductor layer, and connected to the second semiconductor layer.

9. The device according to claim 1, wherein
the second semiconductor layer is placed on part of the first semiconductor layer, and
the device further comprises:
a third semiconductor layer of the first conductivity type placed on part of the second semiconductor layer;
a gate electrode placed immediately above a portion of the second semiconductor layer between the first semiconductor layer and the third semiconductor layer;
a gate insulating film placed between the first semiconductor layer, the second semiconductor layer, and the third semiconductor layer on one hand and the gate electrode on the other;
a first electrode connected to the first semiconductor layer; and
a second electrode connected to the third semiconductor layer.

10. The device according to claim 1, wherein the second semiconductor layer contains aluminum.

11. A semiconductor substrate comprising:
a first semiconductor layer of a first conductivity type made of silicon carbide; and
a second semiconductor layer of a second conductivity type made of silicon carbide, placed in junction with the first semiconductor layer, and containing an electrically inactive element.

12. The substrate according to claim 11, wherein the element is carbon.

13. The substrate according to claim 11, wherein a concentration profile of the element along stacking direction of the first semiconductor layer and the second semiconductor layer in the second semiconductor layer is maximized at the upper surface of the second semiconductor layer.

14. The substrate according to claim 11, wherein a lower portion of the second semiconductor layer does not contain the element.

15. The substrate according to claim 11, wherein the substrate is monocrystalline wafer having a diameter of 6 inches or more.

16. The substrate according to claim 11, wherein the second semiconductor layer contains aluminum.

* * * * *